United States Patent
Nobori et al.

(10) Patent No.: US 12,267,919 B2
(45) Date of Patent: Apr. 1, 2025

(54) CERAMIC HEATER AND METHOD OF MANUFACTURING THE SAME

(71) Applicant: NGK INSULATORS, LTD., Nagoya (JP)

(72) Inventors: Kazuhiro Nobori, Nagoya (JP); Takuji Kimura, Nagoya (JP); Shuichiro Motoyama, Nagoya (JP)

(73) Assignee: NGK INSULATORS, LTD., Nagoya (JP)

(*) Notice: Subject to any disclaimer, the term of this patent is extended or adjusted under 35 U.S.C. 154(b) by 853 days.

(21) Appl. No.: 17/444,753

(22) Filed: Aug. 10, 2021

(65) Prior Publication Data

US 2021/0378061 A1 Dec. 2, 2021

Related U.S. Application Data

(63) Continuation of application No. PCT/JP2020/009002, filed on Mar. 3, 2020.

(30) Foreign Application Priority Data

Mar. 18, 2019 (JP) .................. 2019-050231

(51) Int. Cl.
*H05B 3/28* (2006.01)
*C04B 35/64* (2006.01)
(Continued)

(52) U.S. Cl.
CPC ............. *H05B 3/283* (2013.01); *C04B 35/64* (2013.01); *H01L 21/02* (2013.01); *H01L 21/683* (2013.01);
(Continued)

(58) Field of Classification Search
CPC . H05B 3/283; H05B 3/06; H05B 3/16; H05B 2203/017; H05B 2203/013;
(Continued)

(56) References Cited

U.S. PATENT DOCUMENTS 5,688,331 A * 11/1997 Aruga .................... C23C 16/46
118/728
2004/0094871 A1 5/2004 Ito et al.
(Continued)

FOREIGN PATENT DOCUMENTS

CN 105556656 A 5/2016
JP 2009-176569 A 8/2009
(Continued)

OTHER PUBLICATIONS

International Search Report and Written Opinion (Application No. PCT/JP2020/009002) dated Jun. 2, 2020.
(Continued)

*Primary Examiner* — Brian W Jennison
*Assistant Examiner* — Daniel Ward Hatten
(74) *Attorney, Agent, or Firm* — BURR PATENT LAW, PLLC (57) ABSTRACT

A ceramic heater includes: a ceramic plate which is provided with a wafer placement surface on an upper surface and in which a heating resistor is internally embedded; a ceramic tubular shaft with an upper end bonded to a lower surface of the plate; and power feeding members which penetrate a peripheral wall part of the tubular shaft in a vertical direction, and are electrically connected to the heating resistor. The power feeding members are embedded in the peripheral wall part of the tubular shaft, and are in tight contact with a ceramic material of the tubular shaft.

10 Claims, 6 Drawing Sheets

(51) Int. Cl.
  *H01L 21/02* (2006.01)
  *H01L 21/683* (2006.01)
  *H05B 3/06* (2006.01)
  *H05B 3/16* (2006.01)
  *H05B 3/18* (2006.01)

(52) U.S. Cl.
  CPC ............. *H05B 3/06* (2013.01); *H05B 3/16* (2013.01); *H05B 3/18* (2013.01); *H05B 2203/017* (2013.01)

(58) Field of Classification Search
  CPC . H05B 2203/016; C04B 35/64; C04B 35/622; C04B 2235/6023; C04B 2237/343; C04B 2237/366; C04B 2237/68; C04B 2237/765
  USPC ........................................................ 219/541
  See application file for complete search history.

(56) References Cited

U.S. PATENT DOCUMENTS

| | | | |
|---|---|---|---|
| 2006/0096972 A1* | 5/2006 | Nakamura | H01L 21/67103 219/544 |
| 2006/0182908 A1 | 8/2006 | Fujii | |
| 2007/0045271 A1 | 3/2007 | Kimura et al. | |
| 2011/0126765 A1 | 6/2011 | Yamazawa et al. | |
| 2012/0211933 A1 | 8/2012 | Goto | |
| 2013/0256966 A1* | 10/2013 | Volfovski | H05B 3/26 269/302 |
| 2015/0076135 A1* | 3/2015 | Merry | H01L 21/67103 219/448.11 |
| 2017/0127475 A1 | 5/2017 | Nagai et al. | |
| 2018/0204754 A1* | 7/2018 | Tokusho | H01L 21/68792 |

FOREIGN PATENT DOCUMENTS

| | | |
|---|---|---|
| JP | 5008875 B2 | 8/2012 |
| JP | 2016-536803 A | 11/2016 |
| JP | 2017-085087 A | 5/2017 |
| JP | 2017-162878 A | 9/2017 |
| JP | 2017-183609 A | 10/2017 |
| KR | 10-2003-0007929 A | 1/2003 |
| KR | 10-2012-0060911 A | 6/2012 |
| TW | 200725796 A | 7/2007 |
| TW | 201143553 A1 | 12/2011 |
| TW | 201515145 A | 4/2015 |

OTHER PUBLICATIONS

Taiwanese Office Action (Application No. 109107656) dated Nov. 13, 2020.
Chinese Office Action (Application No. 202080021793.9) dated Dec. 7, 2023 (with English translation) (18 pages).
English translation of the International Preliminary Report on Patentability (Chapter I) dated Sep. 30, 2021 (Application No. PCT/JP2020/009002).
Korean Office Action (with English translation) dated Apr. 6, 2023 (Application No. 10-2021-7025405).
Taiwanese Office Action dated Jun. 23, 2022 (Application No. 109107656).

* cited by examiner

CERAMIC HEATER AND METHOD OF MANUFACTURING THE SAME

BACKGROUND OF THE INVENTION

1. Field of the Invention

The present invention relates to a ceramic heater and a method of manufacturing the ceramic heater.

2. Description of the Related Art

In a semiconductor manufacturing device, a ceramic heater to heat a wafer is used. As disclosed in PTL 1, a ceramic heater like this is known, which includes: a ceramic plate in which a heating resistor is incorporated; a ceramic tubular shaft which is bonded to the lower surface of the plate; and power feeding members which are each inserted into a through-hole and electrically connected to the heating resistor, the through-hole penetrating the peripheral wall of the tubular shaft in a vertical direction. Since the power feeding members are inserted into respective through-holes, the following description is given: there is no risk of electrical contact with each other and even when a large number of heating resistors are provided, power can be successfully fed to each resistance heating element via a power feeding member.

CITATION LIST

Patent Literature

PTL 1: JP 2017-162878 A

SUMMARY OF THE INVENTION

However, in PTL 1, the power feeding members are each inserted into a through-hole with space, which penetrates the peripheral wall of the tubular shaft in a vertical direction, thus when a stress is applied to a power feeding member, the power feeding member is deflected from side to side in the through-hole, and bonding between the power feeding member and the heating resistor may be broken.

The present invention has been devised to solve such a problem, and it is a main object to ensure the bonding between each power feeding member and its heating resistor even when a stress is applied to the power feeding member.

A ceramic heater of the present invention includes:

a ceramic plate which is provided with a wafer placement surface on an upper surface and in which a heating resistor is internally embedded;

a ceramic tubular shaft with an upper end bonded to a lower surface of the plate; and a power feeding member which penetrates a peripheral wall part of the tubular shaft in a vertical direction, and is electrically connected to the heating resistor.

The power feeding member is embedded in the peripheral wall part of the tubular shaft, and is in tight contact with a ceramic material of the tubular shaft.

In this ceramic heater, the power feeding member is embedded in the peripheral wall part of the tubular shaft, and is in tight contact with the ceramic material of the tubular shaft. Therefore, even when a stress is applied to the power feeding member, the power feeding member is not deflected in the peripheral wall part of the tubular shaft, and the bonding between the power feeding member and the heating resistor is ensured.

Note that in the present description, "above", "below" do not represent an absolute positional relationship, but represent a relative positional relationship. Thus, depending on the orientation of the ceramic heater, the "above", "below" may indicate "left" "right", or indicate "front", "back", or indicate "below", "above".

In the ceramic heater of the present invention, the tubular shaft may have an outward flange at the upper end, and the power feeding member may be electrically connected to the heating resistor through the outward flange. In this manner, when the outward flange of the tubular shaft is pressed against the lower surface of the plate at the time of manufacturing the ceramic heater, the power feeding member is pressed against the heating resistor, thus the tubular shaft and the plate can be bonded while ensuring electric conduction between the power feeding member and the heating resistor.

In the ceramic heater of the present invention, from the lower end to a predetermined height of the tubular shaft may be a small diameter part, and from the predetermined height to the upper end thereof may be an enlarged diameter part which is larger in diameter than the small diameter part. In this manner, even when a large number of heating resistors are provided, each power feeding member can be connected to a corresponding heating resistor relatively easily.

In the ceramic heater of the present invention, the plate may have an inner-peripheral-side resistance heating element disposed in the inner peripheral zone of the plate, and an outer-peripheral-side resistance heating element disposed as the heating resistor in the outer peripheral zone of the plate. In this manner, the power feeding member connected to the outer-peripheral-side resistance heating element is not disposed in the inner space of the tubular shaft. Thus, the inner space of the tubular shaft can be utilized for another purpose.

In this case, the inner-peripheral-side resistance heating element may be electrically connected through an inner-peripheral-side connection terminal to the power feeder disposed in the inner space of the tubular shaft, and the end face of the inner-peripheral-side connection terminal may be located at the bottom surface of a hole provided in the lower surface of the plate. In this manner, the inner space of the tubular shaft can be utilized to dispose the power feeder to be connected to the inner-peripheral-side resistance heating element. The end face of the inner-peripheral-side connection terminal is located at the bottom surface of a hole provided in the lower surface of the plate, and such a structure is suitable for using a manufacturing method in which when the tubular shaft and the plate are bonded, the inner-peripheral-side connection terminal is set in a state of being embedded in the plate, and after the bonding, the lower surface of the plate is provided with a hole, and the inner-peripheral-side connection terminal is caused to be exposed to the bottom surface of the hole. In this manner, when the tubular shaft and the plate are bonded, the inner-peripheral-side connection terminal can be prevented from changing in quality.

A method of manufacturing a ceramic heater of the present invention includes:

(a) a step of obtaining a tubular molded body by placing a second mold cast molded body at an outer surface of a first mold cast molded body for producing an inner wall of a ceramic tubular shaft with a power feeding member arranged in a vertical direction on the outer surface of the first mold cast molded body, the second mold cast molded body for producing an outer wall of the tubular shaft;

(b) a step of obtaining the tubular shaft by calcining the tubular molded body;

(c) a step of preparing a ceramic plate in which a heating resistor is embedded, wherein connection terminals respectively in contact with both ends of the heating resistor are exposed from a bonding surface of the plate; and (d) a step of bonding the plate and the tubular shaft by heating the plate and the tubular shaft while pressing the tubular shaft against the plate in a state where the power feeding member is exposed to a bonding surface of the tubular shaft, a metal bonding material is placed between the power feeding member and the connection terminal of the plate, and a ceramic bonding material is placed between the bonding surface of the tubular shaft and the bonding surface of the plate.

By the method of manufacturing a ceramic heater, the above-described ceramic heater can be manufactured relatively easily. In other words, this manufacturing method is suitable for manufacturing the above-described ceramic heater. In addition, with the manufacturing method, it is not necessary to have a through-hole to insert the power feeding member into the tubular shaft, and concurrently with when the tubular shaft and the plate are bonded, the power feeding member and the heating resistor are also bonded, thus the efficiency of the manufacturing work is significantly improved.

In the method of manufacturing a ceramic heater of the present invention, in the step (a), the tubular molded body may be produced to have an outward flange through which the power feeding member passes, and in the step (d), the tubular shaft and the plate may be bonded by heating the plate and the tubular shaft while pressing the tubular shaft against the plate in a state where the power feeding member is exposed to an end face of the outward flange of the tubular shaft, the metal bonding material is placed between the power feeding member and the connection terminal, and the ceramic bonding material is placed between the end face of the outward flange and the bonding surface of the plate. In this manner, concurrently with when the outward flange of the tubular shaft is pressed against the plate, the power feeding member is pressed against the heating resistor, thus the tubular shaft and the plate can be bonded while ensuring electric conduction between the power feeding member and the heating resistor.

In the method of manufacturing a ceramic heater of the present invention, of the tubular shaft, from an end face of the tubular shaft, the end face being on an opposite side of the bonding surface of the tubular shaft to a predetermined height may be a small diameter part, and from the predetermined height to the bonding surface may be an enlarged diameter part which is larger in diameter than the small diameter part. In this manner, even when a large number of heating resistors are provided, each power feeding member can be connected to a corresponding heating resistor relatively easily.

In the method of manufacturing a ceramic heater of the present invention, in the step (c), the plate may be prepared, which has an inner-peripheral-side resistance heating element in an inner periphery zone of the plate, and an outer-peripheral-side resistance heating element as the heating resistor in an outer periphery zone of the plate. In this manner, the power feeding member connected to the outer-peripheral-side resistance heating element is not disposed in the inner space of the tubular shaft. Thus, the inner space of the tubular shaft can be utilized for another purpose.

In this case, the inner-peripheral-side resistance heating element is electrically connected through an inner-peripheral-side connection terminal to a power feeder disposed in an inner space of the tubular shaft, and in the step (d), when the plate and the tubular shaft are bonded, the inner-peripheral-side connection terminal may be in a state of not being exposed from the plate but embedded in the plate, and after the plate and the tubular shaft are bonded, the plate may be provided with a hole, and an end face of the inner-peripheral-side connection terminal may be caused to be exposed to a bottom surface of the hole. In this manner, the inner space of the tubular shaft can be utilized to dispose the power feeder to be connected to the inner-peripheral-side resistance heating element. In addition, when the tubular shaft and the plate are bonded, the inner-peripheral-side connection terminal can be prevented from changing in quality.

DETAILED DESCRIPTION OF THE INVENTION

Figure 1:
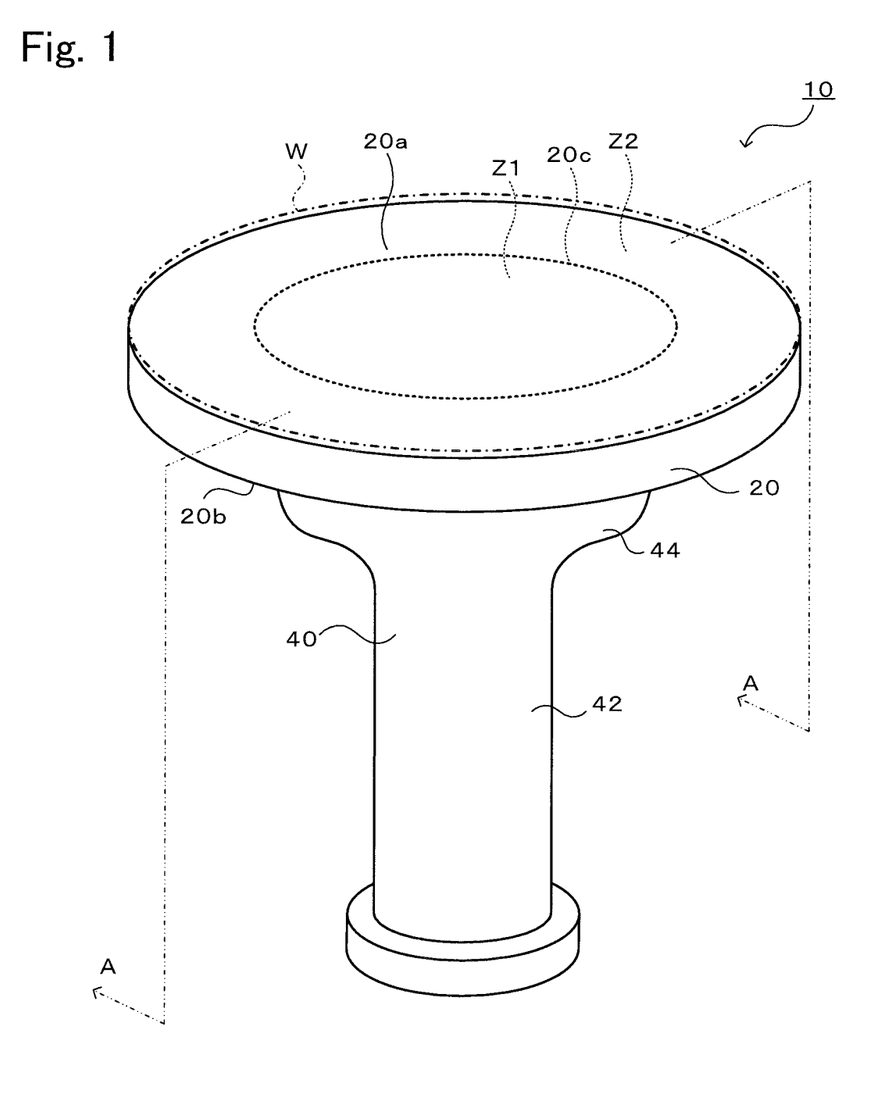
FIG. 1 is a perspective view of a ceramic heater 10.
Figure 2:
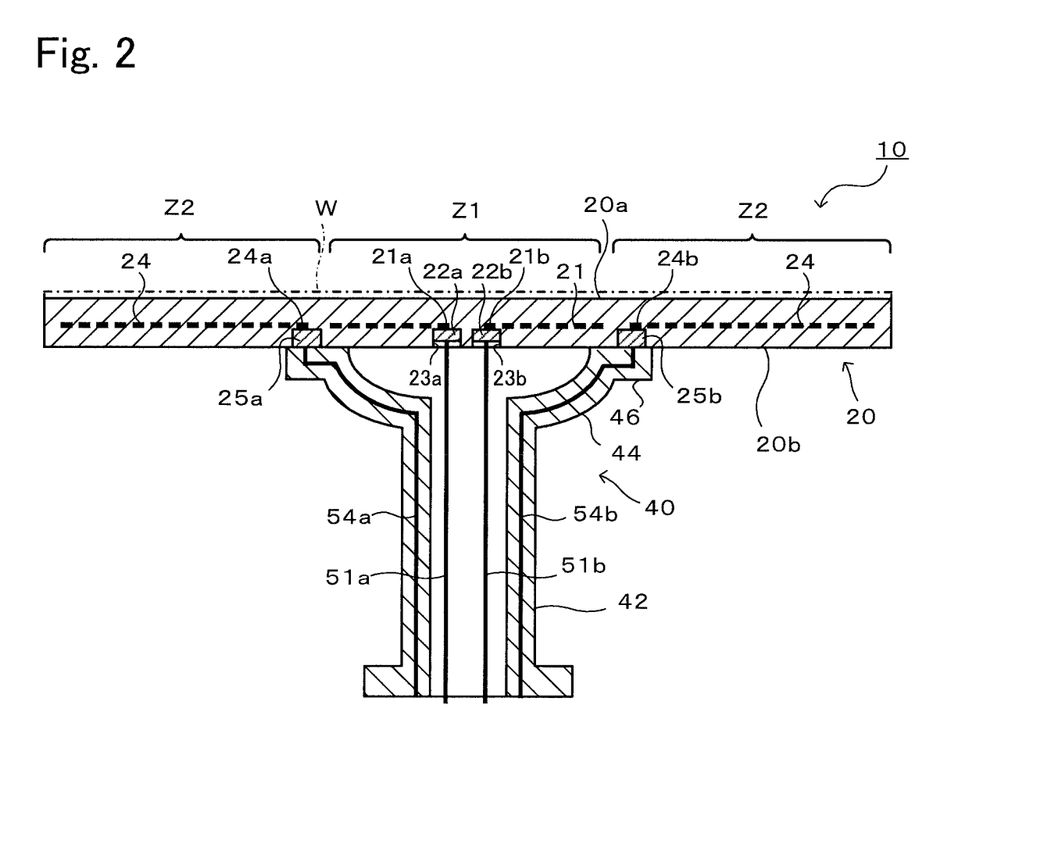
FIG. 2 is a cross-sectional view taken along A-A of FIG. 1.

A preferred embodiment of the present invention will be described below with reference to the drawings. FIG. 1 is a perspective view of a ceramic heater 10, and FIG. 2 is a cross-sectional view taken along A-A of FIG. 1.

The ceramic heater 10 is used to heat a wafer which undergoes processing such as etching and CVD, and is installed in a vacuum chamber which is not illustrated. The ceramic heater 10 includes a ceramic plate 20 provided with a wafer placement surface 20a on the upper surface; and a ceramic tubular shaft 40 bonded to a lower surface 20b of the plate 20.

The plate 20 is a disk-shaped plate composed of a ceramic material represented by aluminum nitride and alumina. The diameter of the plate 20 is not particularly limited, and is approximately 300 mm, for example. The plate 20 is divided into a small circular inner periphery zone Z1 and a ring-shaped outer peripheral zone Z2 by a virtual boundary 20c (see FIG. 1) which is concentric with the plate 20. The inner-peripheral-side resistance heating element 21 is embedded in the inner periphery zone Z1 of the plate 20, and the outer-peripheral-side resistance heating element 24 is embedded in the outer peripheral zone Z2. Both resistance heater elements 21, 24 are each comprised of a coil which is primarily composed of molybdenum, tungsten or tungsten carbide, for example.

Like the plate 20, the tubular shaft 40 is formed of ceramics such as aluminum nitride, alumina. The upper end of the tubular shaft 40 is solid-phase bonded or diffusion-bonded to the plate 20. Of the tubular shaft 40, from the lower end to a predetermined height is a small diameter part 42 having a constant diameter, and from the predetermined height to the upper end is an enlarged diameter part 44 which is larger in diameter than the small diameter part 42. In the present embodiment, the enlarged diameter part 44 has a shape which has a larger diameter at a position closer to the upper end. The upper end of the tubular shaft 40 is provided with the outward flange 46.

The inner-peripheral-side resistance heating element 21 is formed so that it is wired from one end 21*a* to substantially entire area of the inner periphery zone Z1 in a one-stroke pattern while being turned up in multiple turn-up portions, then reaches the other end 21*b*. The ends 21*a*, 21*b* are provided in an inner-side area (shaft inner area) of the tubular shaft 40 of the plate 20. The end 21*a* is connected to a power feeder 51*a* through a cylindrical connection terminal 22*a*, and the end 21*b* is connected to a power feeder 51*b* through a cylindrical connection terminal 22*b*. The lower end surfaces of the connection terminals 22*a*, 22*b* are located at the bottom surfaces of circular holes 23*a*, 23*b* provided in the lower surface 20*b* of the plate 20. The power feeders 51*a*, 51*b* are connected to a first external power supply which is not illustrated. Therefore, electric power is supplied to the inner-peripheral-side resistance heating element 21 from the first external power supply through the power feeders 51*a*, 51*b* and the connection terminals 22*a*, 22*b*. Note that the power feeders 51*a*, 51*b* may be a metal wire covered with an insulating material or a metal wire not covered with an insulating material. In addition, the material of the connection terminals 22*a*, 22*b* and the material of the metal wires of the power feeder 51*a*, 51*b* are the same as the material of the inner-peripheral-side resistance heating element 21.

The outer-peripheral-side resistance heating element 24 is formed so that it is wired from one end 24*a* to substantially entire area of the outer periphery zone Z2 in a one-stroke pattern while being turned up in multiple turn-up portions, then reaches the other end 24*b*. The ends 24*a*, 24*b* are provided at positions opposed to the outward flange 46 of the tubular shaft 40. The end 24*a* is connected to a power feeding member 54*a* through a cylindrical connection terminal 25*a*, and the end 24*b* is connected to a power feeding member 54*b* through a cylindrical connection terminal 25*b*. The lower end surfaces of the connection terminals 25*a*, 25*b* are flush with the lower surface 20*b* of the plate 20. The power feeding members 54*a*, 54*b* penetrate the peripheral wall part of the tubular shaft 40 in a vertical direction, and are electrically connected to the ends 24*a*, 24*b* of the outer-peripheral-side resistance heating element 24. The power feeding members 54*a*, 54*b* are metal wires primarily composed of tungsten or molybdenum, for example, which are embedded in the peripheral wall part of the tubular shaft 40, and are in tight contact with the ceramic material of the tubular shaft 40. Specifically, the power feeding members 54*a*, 54*b* are exposed from the lower end of the tubular shaft 40 to the upper end surface of the outward flange 46 through the peripheral wall part of the small diameter part 42 and the peripheral wall part of the enlarged diameter part 44. The power feeding members 54*a*, 54*b* are connected to a second external power supply (a power supply different from the first external power supply) which is not illustrated. Therefore, electric power is supplied to the outer-peripheral-side resistance heating element 24 from the second external power supply through the power feeding members 54*a*, 54*b* and the connection terminals 25*a*, 25*b*. The material of the connection terminals 25*a*, 25*b* is the same as the material of the outer-peripheral-side resistance heating element 24.

Next, an example of use of the ceramic heater 10 will be described. First, the ceramic heater 10 is installed in a vacuum chamber which is not illustrated, and a wafer W is placed on the wafer placement surface 20*a* of the ceramic heater 10. The electric power supplied to the inner-peripheral-side resistance heating element 21 is adjusted by the first external power supply so that the temperature of the inner periphery zone Z1 detected by an inner-peripheral-side thermocouple (not illustrated) reaches a predetermined inner-periphery-side target temperature. Along with this, the electric power supplied to the outer-peripheral-side resistance heating element 24 is adjusted by the second external power supply so that the temperature of the outer periphery zone Z2 detected by an outer-peripheral-side thermocouple (not illustrated) reaches a predetermined outer-periphery-side target temperature. Thus, the temperature of wafer W is controlled to reach a desired temperature. The inside of the vacuum chamber is then set to a vacuum atmosphere or a reduced-pressure atmosphere, a plasma is generated in the vacuum chamber, and CVD film formation is performed or etching is performed on the wafer W utilizing the plasma.

Figure 3A:
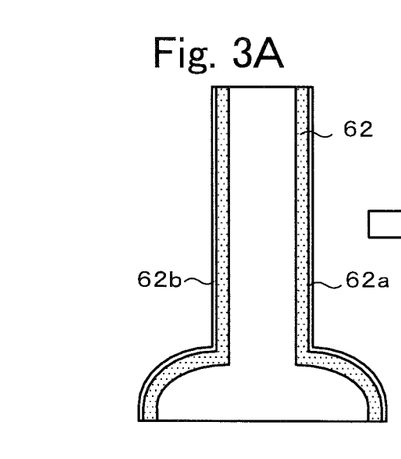
FIGS. 3A to 3E are manufacturing step diagrams of a tubular shaft 40.
Figure 3B:
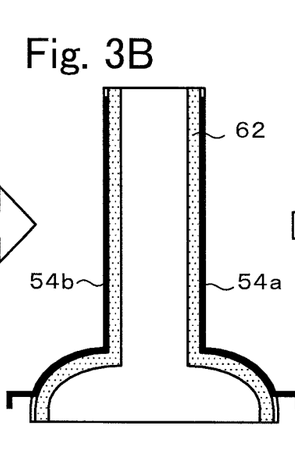
Figure 3C:
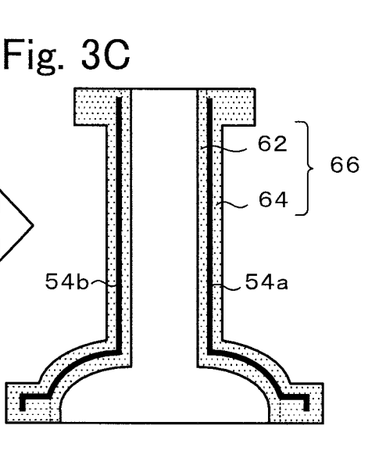
Figure 4A:
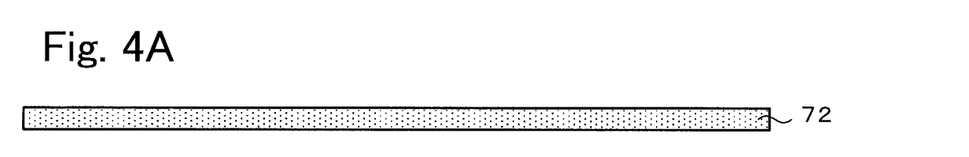
FIGS. 4A to 4E are manufacturing step diagrams of a plate 20.
Figure 4B:
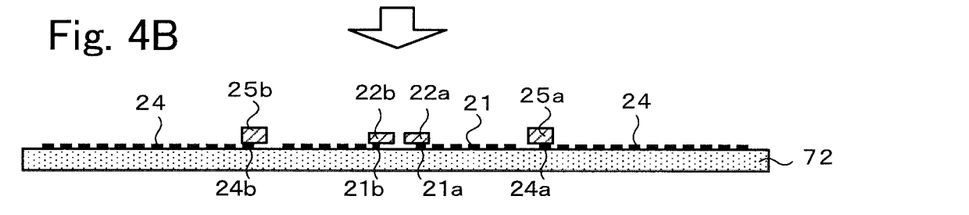
Figure 4C:
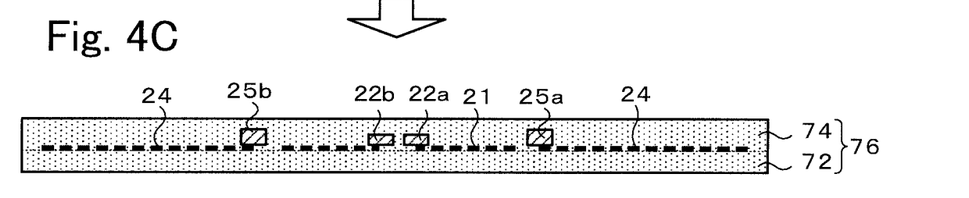
Figure 4D:
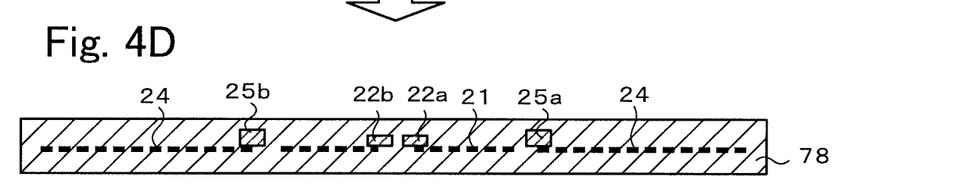
Figure 4E:
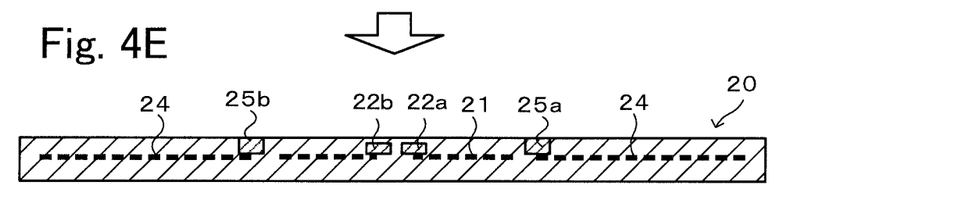
Figure 5A:
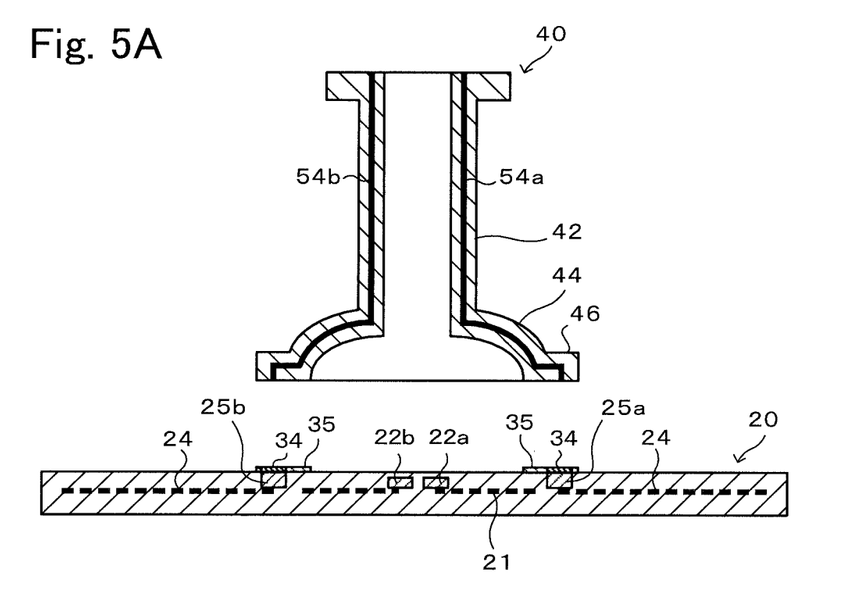
FIGS. 5A and 5B are explanatory diagrams illustrating a step of bonding the plate 20 and the tubular shaft 40.
Figure 5B:
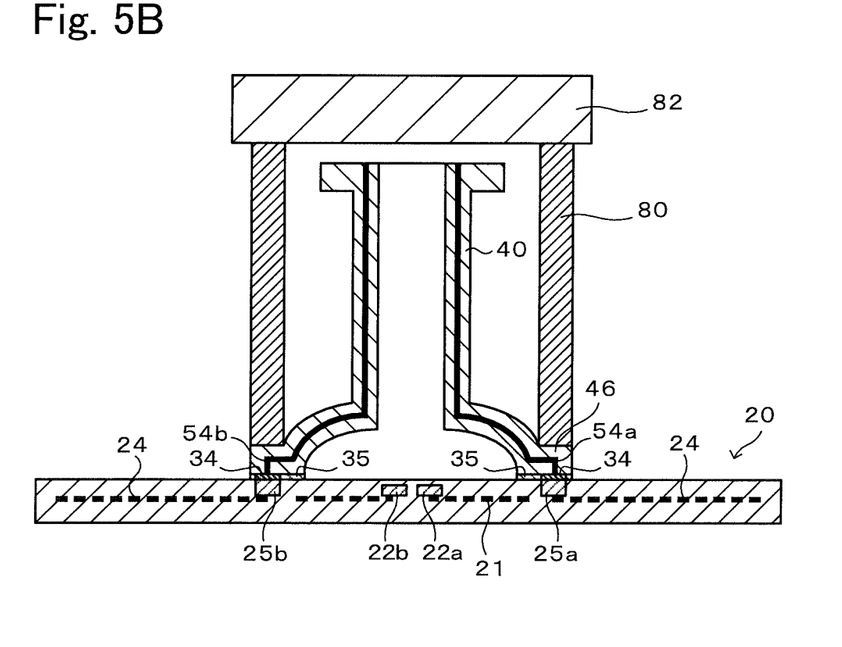

Next, an example of manufacturing the ceramic heater 10 will be described. The manufacturing example includes: (a) step of manufacturing a tubular molded body 66, (b) step of manufacturing the tubular shaft 40, (c) step of manufacturing the plate 20, and (d) step of bonding the plate 20 and the tubular shaft 40. FIGS. 3A to 3E are manufacturing step diagrams of the tubular shaft 40 (including a step of manufacturing the tubular molded body 66), FIGS. 4A to 4E are manufacturing step diagrams of the plate 20, and FIGS. 5A and 5B are explanatory diagrams illustrating a step of bonding the plate 20 and the tubular shaft 40.

*Step (a)

The tubular molded body 66 is produced. First, a first molded body 62 for producing the inner wall of the tubular shaft 40 is produced by mold cast molding, and two grooves 62*a*, 62*b* for placing the power feeding members 54*a*, 54*b* are provided in the outer surface of the first molded body 62 (see FIG. 3A). The mold cast molding is a method which may be referred to as gel cast molding, and the details are disclosed in Japanese Patent No. 5458050, for example. In the mold cast molding, ceramic slurry containing ceramic powder, a solvent, a dispersing agent and a gelling agent is poured into a first mold die having an internal space in the same shape as the first molded body 62 to cause a chemical reaction in the gelling agent, and turn the ceramic slurry into a gel, then the first molded body 62 is obtained by demolding the gel. The solvent is not particularly limited as long as it dissolves the dispersing agent and the gelling agent, however, it is preferable to use a solvent having two or more ester bonds, such as polybasic acid ester (for example, glutaric acid dimethyl), acid ester (for example, triacetin) of polyvalent alcohol. The dispersing agent is not particularly limited as long as it disperses the ceramic powder uniformly in the solvent, however, it is preferable to use polycarboxylic acid-based copolymer, polycarboxylate or the like. The gelling agent may contain isocyanates, polyols and a catalyst, for example. Of these, the isocyanates are not particularly limited as long as they are materials having an isocyanate group as a functional group. Such materials include, for example, tolylene diisocyanate (TDI), diphenylmethane diisocyanate (MDI) and a denaturation body of these. The polyols are not particularly limited as long as they are materials having two or more hydroxyl groups which can react with an isocyanate group. Such materials include, for example, ethylene glycol (EG), polyethylene glycol (PEG), propylene glycol (PG), and polypropylene glycol (PPG). The catalyst is not particularly limited as long as it is a material which promotes urethane reaction with isocyanates and polyols. Such a material includes, for example, triethylenediamine, hexanediamine, and 6-dimethylamino-1-hexanol. Herein, gelation reaction is such that isocyanates and polyols cause urethane reaction, and turn into urethane resin (polyurethane). The ceramic slurry is turned into a gel by reaction of the gelling agent, and the urethane resin functions as an organic binder.

Subsequently, prefabricated power feeding members 54a, 54b are fitted into the grooves 62a, 62b of the first molded body 62 to achieve the shape illustrated in FIG. 2 (see FIG. 3B). Thus, the power feeding members 54a, 54b are in a state of arranged on the outer surface of the first molded body 62 in a vertical direction.

Subsequently, the second molded body 64 for producing the outer wall of the tubular shaft 40 is produced at the outer surface of the first molded body 62 by mold cast molding, and the tubular molded body 66 is obtained (see FIG. 3C). Here, the first molded body 62 is inserted into a mold die having an internal space in the same shape as the tubular molded body 66, then the same ceramic slurry as mentioned above is poured into the remaining inner space to cause chemical reaction of the gelling agent, and after the ceramic slurry is turned into a gel, the tubular molded body 66 is obtained by demolding the gel. The tubular molded body 66 is such that the second molded body 64 is formed outside of the first molded body 62. The power feeding members 54a, 54b are not exposed from the upper end and the lower end of the tubular molded body 66, and are embedded in the tubular molded body 66.

*Step (b)

Figure 3D:
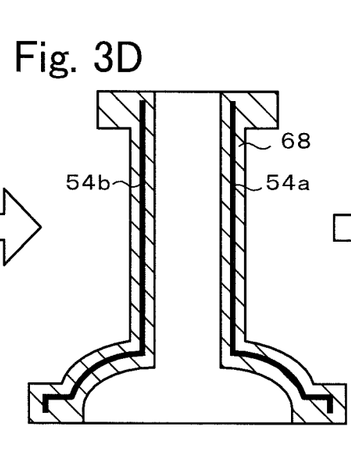
Figure 3E:
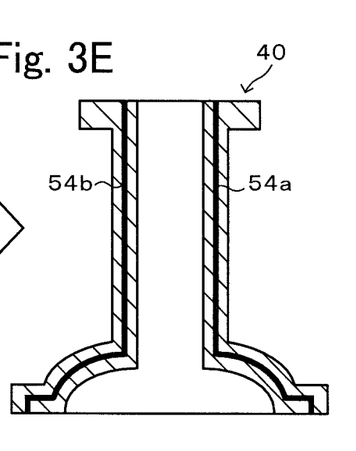

The tubular molded body 66 is dried, degreased, then calcined, thus a tubular calcined body 68 is obtained (see FIG. 3D). The drying is performed to evaporate the solvent contained in the tubular molded body 66. A drying temperature and a drying time should be set as appropriate depending on the solvent used. However, the drying temperature is set carefully so that no cracking occurs in the tubular molded body 66 during drying. The degreasing after the drying is performed to decompose and remove the organic matter, such as the dispersing agent and the catalyst, contained in the tubular molded body 66. A degreasing temperature should be set as appropriate depending on the type of the organic matter contained, and may be set at 400 to 600° C., for example. The calcination after the degreasing is performed to calcinate the ceramic particles contained in the tubular molded body 66. The calcination temperature should be set as appropriate according to the type and particle diameter of the ceramic powder, and is preferably set in a range of 1000 to 2000° C. Note that an atmosphere should be selected from an air atmosphere, an inert atmosphere, and a vacuum atmosphere according to the type of the ceramic powder. For example, when the ceramic powder is aluminum nitride powder, it is preferable to perform drying, degreasing, calcining under an inert atmosphere. Subsequently, the upper end and the lower end of the tubular calcined body 68 are ground to cause the upper end and the lower end of the power feeding members 54a, 54b to be exposed, thus the tubular shaft 40 is obtained (see FIG. 3E). In this manner, the power feeding members 54a, 54b are embedded in the tubular molded body 66 utilizing the mold cast molding, then are calcined to obtain the tubular shaft 40, thus the power feeding members 54a, 54b come into tight contact with the ceramic material of the tubular shaft 40.

*Step (c)

The plate 20 is produced by the procedure in FIGS. 4A to 4E. First, a disk-shaped first molded body 72 for producing a wafer placement surface 20a-side part of the plate 20 is produced by the mold cast molding (see FIG. 4A). Here, the same ceramic slurry as in step (a) is poured into a mold die having an internal space in the same shape as the first molded body 72 to cause chemical reaction of the gelling agent, and after the ceramic slurry is turned into a gel, a first molded body 72 is obtained by demolding the gel.

Subsequently, the inner-peripheral-side resistance heating element 21 and the outer-peripheral-side resistance heating element 24 are disposed on the surface of the first molded body 72, connection terminals 22a, 22b are respectively disposed on both ends 21a, 21b of the inner-peripheral-side resistance heating element 21, and connection terminals 25a, 25b are respectively disposed on both ends 24a, 24b of the outer-peripheral-side resistance heating element 24 (see FIG. 4B).

Subsequently, a disk-shaped second molded body 74 for producing the bonding surface-side part of the plate 20 is produced on the surface of the first molded body 72 by the mold cast molding, and a disk-shaped molded body 76 is obtained (see FIG. 4C). Here, the first molded body 72 of FIG. 4B is inserted into a mold die having an internal space in the same shape as the disk-shaped molded body 76, then the same ceramic slurry as mentioned above is poured into the remaining inner space. Then, chemical reaction of the gelling agent is caused, and after the ceramic slurry is turned into a gel, the disk-shaped molded body 76 is obtained by demolding the gel. The disk-shaped molded body 76 is a molded body in which the second molded body 74 is laminated on the surface of the first molded body 72, and includes the inner-peripheral-side and outer-peripheral-side resistance heating elements 21, 24, and the connection terminals 22a, 22b, 25a, 25b.

Subsequently, the disk-shaped molded body 76 is dried, degreased, then calcined, thus a disk-shaped calcined body 78 is obtained (see FIG. 4D). The drying, degreasing and calcining are performed in the same manner as when the tubular calcined body 68 is obtained from the tubular molded body 66. Subsequently, the surface of the disk-shaped calcined body 78 is ground to cause the connection terminals 25a, 25b to be exposed, thus the plate 20 is obtained (see FIG. 4E). In this stage, the connection terminals 22a, 22b remain to be embedded in the plate 20.

*Step (d)

The plate 20 obtained in step (c) and the tubular shaft 40 obtained in step (b) are bonded. First, as illustrated in FIG. 5A, a metal paste 34 as a metal bonding material is applied to the connection terminals 25a, 25b exposed to the surface of the plate 20, and a ceramic bonding material 35 is applied to the surroundings of the applied metal paste 34. For the metal contained in the metal paste 34, the same metal as in the inner-peripheral-side and outer-peripheral-side resistance heating elements 21, 24 may be used. The ceramic bonding material 35 includes a solution for bonding assistance (for example, yttrium nitrate aqueous solution) used for solid-phase bonding.

Subsequently, as illustrated in FIG. 5B, the tubular shaft 40 is placed on the plate 20 so that the plate 20 and the tubular shaft 40 are coaxial. At this point, of the power feeding members 54a, 54b, the part exposed from the end face of the outward flange 46 is brought into contact with the metal paste 34. In addition, the end face of the outward flange 46 is brought into contact with the ceramic bonding material 35. Consequently, a state is achieved in which the metal paste 34 is placed between the ends of the power feeding members 54a, 54b and the connection terminals 25a, 25b, and the ceramic bonding material 35 is placed between the end face of the tubular shaft 40 and the surface of the plate 20. A pressurized tube 80 is then inserted into the tubular shaft 40, the pressurized tube 80 is placed on the outward flange 46 of the tubular shaft 40, and a weight 82 is further placed on the pressurized tube 80. This is installed in a heating furnace which is not illustrated, and is increased in temperature to a predetermined high temperature (for example, 1800 to 2000° C.) under an inert gas atmosphere, and is maintained at the temperature for a predetermined time and is decreased in temperature. By doing this, the outward flange 46 of the tubular shaft 40 is heated with pressed against the plate 20 by the weight 82, thus ceramics of the outward flange 46 and the tubular shaft 40 are solid-phase bonded. In addition, the power feeding members 54a, 54b exposed to the end face of the outward flange 46 are bonded to the connection terminals 25a, 25b via a metal layer which is generated by solidification of the metal paste 34.

Subsequently, circular holes 23a, 23b are opened at the positions, on the surface of the plate 20, opposed to the connection terminals 22a, 22b, and the end faces of the connection terminals 22a, 22b are exposed to the bottom surfaces of the circular holes 23a, 23b. The power feeders 51a, 51b are electrically connected to the connection terminals 22a, 22b through a brazing material, and the ceramic heater 10 of FIG. 2 is obtained.

In the ceramic heater 10 of the present embodiment described above, the power feeding members 54a, 54b are embedded in the peripheral wall part of the tubular shaft 40, and are in tight contact with the ceramic material of the tubular shaft 40. Therefore, even when a stress is applied to the power feeding members 54a, 54b, the power feeding members 54a, 54b are not deflected in the peripheral wall part of the tubular shaft 40, and the bonding between the power feeding members 54a, 54b and the outer-peripheral-side resistance heating element 24 is ensured.

In addition, the tubular shaft 40 has the outward flange 46 at the upper end, and the power feeding members 54a, 54b are electrically connected to the outer-peripheral-side resistance heating element 24 through the outward flange 46. Thus, at the time of manufacturing the ceramic heater 10, concurrently with when the outward flange 46 of the tubular shaft 40 is pressed against the plate 20, the power feeding members 54a, 54b are pressed against the connection terminals 25a, 25b of the outer-peripheral-side resistance heating element 24. Therefore, the tubular shaft 40 and the plate 20 can be bonded while ensuring electric conduction between the power feeding members 54a, 54b and the connection terminals 25a, 25b.

In addition, of the tubular shaft 40, from the lower end to a predetermined height is the small diameter part 42, and from the predetermined height to the upper end is the enlarged diameter part 44 which is larger in diameter than the small diameter part 42. Thus, as compared with a tubular shaft in a straight shape, the distance from the upper end to the lower end is longer, and the heat of the plate 20 is unlikely to be transmitted to the lower end of the tubular shaft 40. Thus, when the lower end of the tubular shaft 40 is connected to another member via an O-ring which is not illustrated, the O-ring can be prevented from deteriorating due to heat.

Furthermore, the inner-peripheral-side resistance heating element 21 is disposed in the inner periphery zone Z1 of the plate 20, the outer-peripheral-side resistance heating element 24 is disposed in the outer peripheral zone Z2 of the plate 20, and the power feeding members 54a, 54b embedded in the peripheral wall part of the tubular shaft 40 are electrically connected to the outer-peripheral-side resistance heating element 24. In other words, the power feeding members 54a, 54b connected to the outer-peripheral-side resistance heating element 24 are not disposed in the inner space of the tubular shaft 40. Thus, the inner space of the tubular shaft can be utilized for another purpose. In the above-described embodiment, the inner space of the tubular shaft 40 is utilized to dispose the power feeders 51a, 51b connected to the inner-peripheral-side resistance heating element 21.

Also, the end faces of the connection terminals 22a, 22b are located at the bottom surfaces of the circular holes 23a, 23b provided in the lower surface of the plate 20, and such a structure is suitable for using a manufacturing method in which when the tubular shaft 40 and the plate 20 are bonded, the connection terminals 22a, 22b are set in a state of being embedded in the plate 20, and after the bonding, the lower surface 20b of the plate 20 is provided with the circular holes 23a, 23b, and the connection terminals 22a, 22b are caused to be exposed to the bottom surfaces of the circular holes 23a, 23b. In this manner, when the tubular shaft 40 and the plate 20 are bonded, the connection terminals 22a, 22b can be prevented from changing in quality.

Furthermore, in the above-described manufacturing example, it is not necessary to have through-holes to insert the power feeding members 54a, 54b into the tubular shaft 40, and concurrently with when the tubular shaft 40 and the plate 20 are bonded, the power feeding members 54a, 54b and the connection terminals 25a, 25b are also bonded, thus the efficiency of the manufacturing work is significantly improved.

Note that the present invention is not particularly limited to the above-described embodiment, and it goes without saying that the present invention can be implemented in various modes as long as it belongs to the technical scope of the invention.

For example, in the above-described embodiment, of the tubular shaft 40 in FIG. 2, from the lower end to a predetermined height is the small diameter part 42, and from the predetermined height to the upper end is the enlarged diameter part 44 which is larger in diameter than the small diameter part 42. For this reason, even when the outer peripheral zone Z2 is divided into multiple small zones, and each small zone is provided with an outer-peripheral-side resistance heating element, a power feeding member can be connected to the outer-peripheral-side resistance heating element relatively easily. For example, when for the tubular shaft 40 having the enlarged diameter part 44 and the tubular shaft in a straight shape, two sets of power feeding members both equal in number are embedded in the peripheral wall parts of the tubular shafts, the interval between the power feeding members exposed to the upper end of each tubular shaft is easily expanded in the former than in the latter. Thus, the distance between the terminals of the outer-peripheral-side resistance heating element can be expanded, and a power feeding member can be connected to the outer-peripheral-side resistance heating element relatively easily. Note that a pair of power feeding members are necessary for each outer-peripheral-side resistance heating element.

Figure 6:
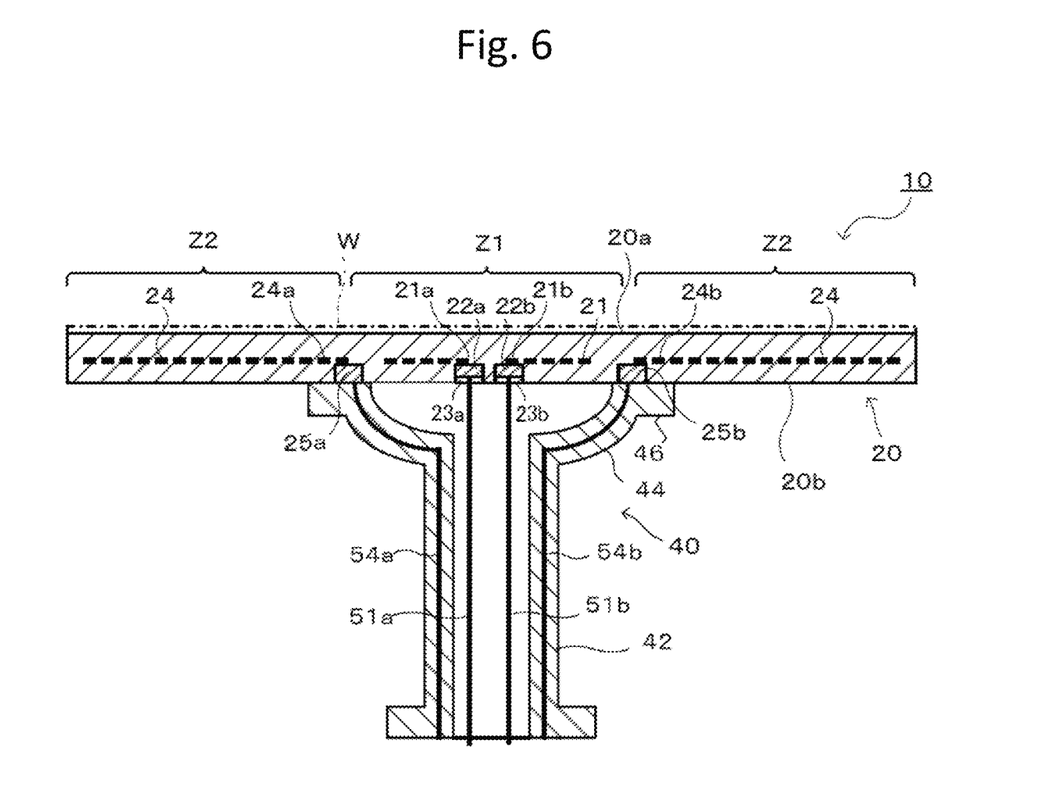
FIG. 6 is a cross-sectional view of another example of the ceramic heater 10.

In the above-described embodiment, the power feeding members 54a, 54b embedded in the tubular shaft 40 are designed to pass through the outward flange 46, however, may be designed not to pass through the outward flange 46 as illustrated in FIG. 6. Alternatively, one of the power feeding members 54a, 54b may be designed to pass through the outward flange 46, and the other may be designed not to pass through the outward flange 46.

In the above-described embodiment, the case has been described in which the plate 20 and the tubular shaft 40 are solid-phase bonded. However, bonding may be performed by a method other than the solid-phase bonding, and for example, TCB bonding (thermal compression bonding) may be used. The details of the TCB bonding are described, for example, in Japanese Patent No. 5008875.

In the above-described embodiment, if the power feeding members 54a, 54b and the connection terminals 25a, 25b of the ceramic heater 10 are not electrically connected, a hole may be opened in the lower surface of the outward flange 46 up to an area which is not electrically connected, and a brazing material is poured into the hole, then after electrical connection is ensured, ceramic powder may be thermally sprayed to close the hole.

In the above-described embodiment, the tubular shaft 40 having the small diameter part 42 and the enlarged diameter part 44 has been exemplified. However, the tubular shaft 40 may have a straight shape.

In the above-described embodiment, the case has been described in which the inner-peripheral-side and outer-peripheral-side resistance heating elements 21, 24 are incorporated in the plate 20. However, an electrostatic electrode may be incorporated in the plate 20, or an RF electrode may be incorporated in the plate 20. The electrostatic electrode is an electrode used for adsorbing a wafer to the wafer placement surface 20a, and the RF electrode is an electrode used for generating a plasma.

The present application claims priority from Japanese Patent Application No. 2019-050231, filed on Mar. 18, 2019, the entire contents of which are incorporated herein by reference.

What is claimed is:

1. A ceramic heater comprising:
   a ceramic plate which is provided with a wafer placement surface on an upper surface and in which a heating resistor is internally embedded;
   a ceramic tubular shaft with an upper end bonded to a lower surface of the plate; and
   a power feeding member which penetrates a peripheral wall part of the tubular shaft in a vertical direction, and is electrically connected to the heating resistor,
   wherein the power feeding member is embedded in the peripheral wall part of the tubular shaft, and is in tight contact with a ceramic material of the tubular shaft, and
   wherein the heating resistor is electrically connected through a cylindrical connection terminal to the power feeding member and a lower end surface of the cylindrical connection terminal is flush with the lower surface of the plate.

2. The ceramic heater according to claim 1,
   wherein the tubular shaft has an outward flange at an upper end, and
   the power feeding member is electrically connected to the heating resistor through the outward flange.

3. The ceramic heater according to claim 1,
   wherein the tubular shaft has a small diameter part and an enlarged diameter part which is larger in diameter than the small diameter part, the small diameter part being from a lower end of the tubular shaft to a predetermined height and the enlarged diameter part being from the predetermined height to an upper end of the tubular shaft.

4. The ceramic heater according to claim 1,
   wherein the plate has an inner-peripheral-side resistance heating element disposed in an inner peripheral zone of the plate, and an outer-peripheral-side resistance heating element disposed as the heating resistor in an outer peripheral zone of the plate.

5. The ceramic heater according to claim 4,
   wherein the inner-peripheral-side resistance heating element is electrically connected through an inner-peripheral-side connection terminal to a power feeder disposed in an inner space of the tubular shaft, and
   an end face of the inner-peripheral-side connection terminal is located at a bottom surface of a hole provided in the lower surface of the plate.

6. A method of manufacturing a ceramic heater, the method comprising:
   (a) a step of obtaining a tubular molded body by placing a second mold cast molded body at an outer surface of a first mold cast molded body for producing an inner wall of a ceramic tubular shaft with a power feeding member arranged in a vertical direction on the outer surface of the first mold cast molded body, the second mold cast molded body for producing an outer wall of the tubular shaft;
   (b) a step of obtaining the tubular shaft by calcining the tubular molded body;
   (c) a step of preparing a ceramic plate in which a heating resistor is embedded, wherein cylindrical connection terminals respectively in contact with both ends of the heating resistor are exposed from a lower bonding surface of the plate and are flush with the lower bonding surface of the plate; and
   (d) a step of bonding the plate and the tubular shaft by heating the plate and the tubular shaft while pressing the tubular shaft against the plate in a state where the power feeding member is exposed to a bonding surface of the tubular shaft, a metal bonding material is placed between the power feeding member and the cylindrical connection terminal of the plate, and a ceramic bonding material is placed between the bonding surface of the tubular shaft and the bonding surface of the plate.

7. The method of manufacturing a ceramic heater according to claim 6,
   wherein in the step (a), the tubular molded body is produced to have an outward flange through which the power feeding member passes, and
   in the step (d), the tubular shaft and the plate are bonded by heating the plate and the tubular shaft while pressing the tubular shaft against the plate in a state where the power feeding member is exposed to an end face of the outward flange of the tubular shaft, the metal bonding material is placed between the power feeding member and the cylindrical connection terminal, and the ceramic bonding material is placed between the end face of the outward flange and the bonding surface of the plate.

8. The method of manufacturing a ceramic heater according to claim 6,
   wherein the tubular shaft has a small diameter part and an enlarged diameter part which is larger in diameter than the small diameter part, the small diameter part being from an end face which is on an opposite side of the bonding surface of the tubular shaft to a predetermined height and the enlarged diameter part being from the predetermined height to the bonding surface.

9. The method of manufacturing a ceramic heater according to claim 6,
   wherein in the step (c), the plate is prepared, which has an inner-peripheral-side resistance heating element in an inner periphery zone of the plate, and an outer-peripheral-side resistance heating element as the heating resistor in an outer periphery zone of the plate.

10. The method of manufacturing a ceramic heater according to claim 9,
- wherein the inner-peripheral-side resistance heating element is to be electrically connected through an inner-peripheral-side connection terminal to a power feeder disposed in an inner space of the tubular shaft, and
- in the step (d), when the plate and the tubular shaft are bonded, the inner-peripheral-side connection terminal is in a state of not being exposed from the plate but embedded in the plate, and after the plate and the tubular shaft are bonded, the plate is provided with a hole, and an end face of the inner-peripheral-side connection terminal is caused to be exposed to a bottom surface of the hole.

\* \* \* \* \*